US009466100B2

(12) United States Patent
Choi et al.

(10) Patent No.: US 9,466,100 B2
(45) Date of Patent: Oct. 11, 2016

(54) FOCUS MONITORING METHOD USING ASYMMETRY EMBEDDED IMAGING TARGET

(71) Applicant: KLA-Tencor Corporation, Milpitas, CA (US)

(72) Inventors: DongSub Choi, Yongin (KR); Bill Pierson, Austin, TX (US); David Tien, Santa Clara, CA (US); James Manka, Sunnyvale, CA (US); Dongsuk Park, WhaSung (KR)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 13/908,623

(22) Filed: Jun. 3, 2013

(65) Prior Publication Data
US 2013/0336572 A1 Dec. 19, 2013

Related U.S. Application Data

(60) Provisional application No. 61/656,330, filed on Jun. 6, 2012.

(51) Int. Cl.
*G06K 9/00* (2006.01)
*G03F 1/00* (2012.01)
*G06T 7/00* (2006.01)

(52) U.S. Cl.
CPC ............ *G06T 7/0004* (2013.01); *G03F 1/00* (2013.01); *G06T 7/0002* (2013.01); *G06T 2207/30148* (2013.01); *G06T 2207/30168* (2013.01)

(58) Field of Classification Search
CPC ............... G06T 7/0004; G06T 7/0002; G06T 2207/30168; G06T 2207/30148; G03F 1/00
See application file for complete search history.

(56) References Cited

U.S. PATENT DOCUMENTS 6,015,991 A * 1/2000 Wheeler et al. .............. 257/336
7,532,307 B2 5/2009 Den Boef et al.
7,656,512 B2 2/2010 Dziura et al.
7,987,436 B2 7/2011 Jessen et al.
(Continued)

FOREIGN PATENT DOCUMENTS

WO 2008089222 A1 7/2008

OTHER PUBLICATIONS

Lithography Process Control Using Scatterometry Metrology and Semi-Physical Modeling Kevin Lensing et al. Metrology, Inspection, and Process Control for Microlithography XXI, edited by Chas N. Archie Proc. of SPIE vol. 6518, 651804, (2007) • 0277-786X/07/$18 • doi: 10.1117/12.711548 http://jason.thecains.org/doc/spie_ml_6518_3.PDF.

(Continued)

*Primary Examiner* — Amara Abdi
(74) *Attorney, Agent, or Firm* — Suiter Swantz pc llo

(57) ABSTRACT

A method for monitoring mask focus includes measuring profile asymmetries in a target feature including sub-resolution assist features and deriving a focus response based on a known correlation between the profile and focus of a corresponding mask. A computer system in a lithographic process may adjust mask focus based on such derived information to conform to a desired fabrication process.

20 Claims, 4 Drawing Sheets

(56) References Cited

U.S. PATENT DOCUMENTS

| | | |
|---|---|---|
| 8,111,398 B2 | 2/2012 | Den Boef et al. |
| 8,134,681 B2 | 3/2012 | Okita |
| 8,413,081 B2 | 4/2013 | Ye et al. |
| 2004/0190008 A1* | 9/2004 | Mieher ............... G01N 21/956 356/625 |
| 2004/0198018 A1 | 10/2004 | Fukuda |
| 2005/0136340 A1* | 6/2005 | Baselmans ............. G03F 1/144 430/5 |
| 2006/0024850 A1* | 2/2006 | Monahan et al. ............. 438/14 |
| 2007/0273853 A1* | 11/2007 | Bleeker et al. ................ 355/46 |
| 2009/0146259 A1 | 6/2009 | Jessen et al. |
| 2010/0007863 A1 | 1/2010 | Jordanoska |
| 2010/0058263 A1 | 3/2010 | Tyminski et al. |
| 2010/0146475 A1 | 6/2010 | Cao et al. |
| 2010/0325591 A1* | 12/2010 | Lippincott .......... G06F 17/5072 716/54 |
| 2011/0027704 A1* | 2/2011 | Cramer ............... G03F 7/70641 430/30 |
| 2011/0065028 A1 | 3/2011 | Kodera et al. |
| 2011/0080585 A1 | 4/2011 | Li et al. |
| 2011/0173578 A1* | 7/2011 | Tsai ....................... G06F 17/50 716/55 |
| 2011/0249247 A1 | 10/2011 | Cramer et al. |

OTHER PUBLICATIONS

A novel robust diffraction-based metrology concept for measurement and monitoring of critical layers in memory devices Author(s): Boo-Hyun Ham et al. Published: Mar. 15, 2010 http://spie.org/x648.html?product_id=848399.

* cited by examiner

FOCUS MONITORING METHOD USING ASYMMETRY EMBEDDED IMAGING TARGET

PRIORITY

The present application claims the benefit under 35 U.S.C. §119(e) of U.S. Provisional Application Ser. No. 61/656,330, filed Jun. 6, 2012, which is incorporated herein by reference.

FIELD OF THE INVENTION

The present invention is directed generally toward semiconductor wafer fabrication and more particularly to maintaining focus during a lithographic process.

BACKGROUND OF THE INVENTION

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etching, deposition, and ion implantation. Multiple semiconductor devices may be fabricated in an arrangement on a single semiconductor wafer and then separated into individual semiconductor devices.

Metrology processes are used at various steps during a semiconductor manufacturing process to monitor and control one or more semiconductor layer processes. For example, during lithography, maintaining sharp focus between the reticle and the resist is vital. Sub-resolution assist features (SRAF) are especially useful where lithographic targets are particularly sensitive to focus. Sub-resolution assist features (SRAF) are very small mask features designed to improve processes margins and enhance resolution for isolated features through additional constructive or destructive interference, but are not intended to be printed on the resulting wafer. Existing lithographic technology requires deconvolution of dose and focus using some form of CD metrology data and separation of data to determine focus response.

While sub-resolution assist features are useful for assisting focus during lithography, existing sub-resolution assist features do not offer a reliable mechanism for maintaining focus. Consequently, it would be advantageous if an apparatus existed that is suitable for monitoring focus of a mask in a lithographic process.

SUMMARY OF THE INVENTION

Accordingly, the present invention is directed to a novel method and apparatus for monitoring focus of a mask in a lithographic process.

In at least one embodiment, a lithographic mask includes sub-resolution assist features to produce asymmetry in profile or image placement or both. Asymmetries enhance or deteriorate image log slope. Profile asymmetry may be altered via focus change, and such changes can be measured during processing.

In another embodiment, a computer system in a lithographic process monitors profile asymmetries of one or more target features. Changes in profile asymmetry are used to derive changes in focus and thereby continually monitor focus during processing.

In another embodiment, a method for monitoring mask focus includes measuring profile asymmetries in a target feature and deriving focus based on a known correlation between the profile and focus of a corresponding mask. Mask focus may be adjusted based on such derived information to conform to a desired fabrication process.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
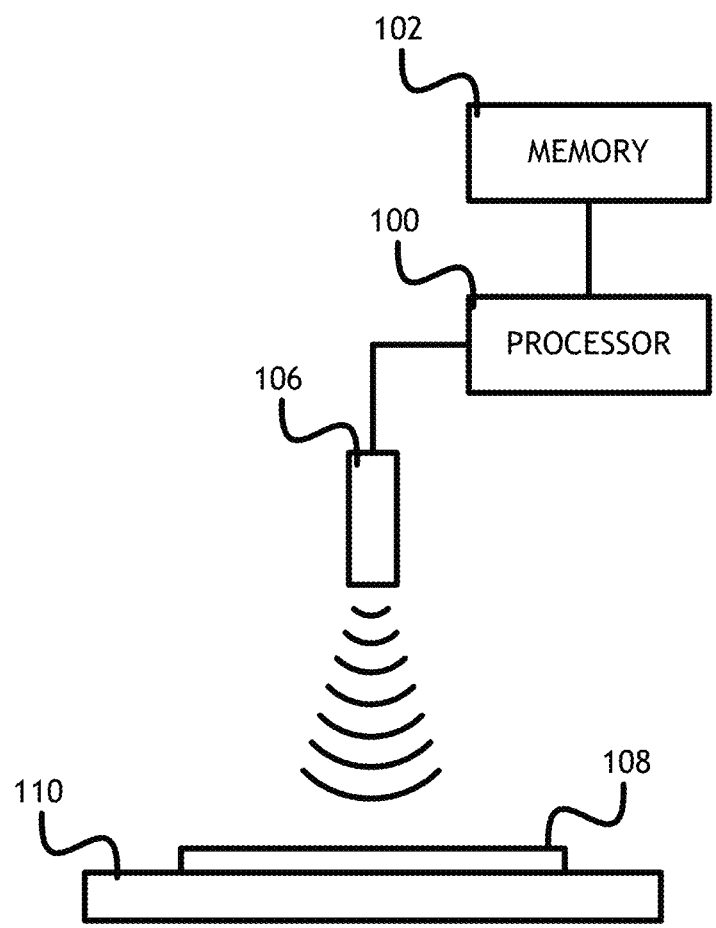
FIG. 1 shows a block diagram of a computer system useful for implementing at least one embodiment of the present invention.

Referring to FIG. 1, a block diagram of a computer system useful for implementing at least one embodiment of the present invention is shown. The computer system may include a processor 100, memory 102 connected to the processor 100 and a measuring device 106 configured to measure a profile asymmetry connected to the processor 100. In a lithographic process, a lithographic mask 108 having a plurality of main features and at least one sub-resolution assist feature is used to produce elements on a semiconductor wafer 110.

During a lithographic process, the processor 100 receives a first projection profile through the measuring device 106 and a second projection profile through the measuring device 106. The first projection profile and the second projection profile are asymmetrical such that profile asymmetries may be measured to indicate a focus of a scanner used in the lithographic processes.

Additionally, measurement device 106 may measure a reference overlay marker so that the processor 100 may determine an overlay error. Based on the overlay error, the processor 100 may determine an image placement error. Unlike overlay error, image placement error is a function of focus. Once an image placement error is calculated, the processor 100 may use the image placement error to determine a focus error.

Profile Asymmetry and Image Placement Error are two separate focus responses on the same target. The processor 100 may combine both profile asymmetry and image placement error to determine a focus response. Based on the focus response, the processor 100 may alter a scanner focus to produce a desired lithographic image. Embodiments of the present invention do not require deconvolution of dose or focus. Furthermore, using embodiments of the present invention, CD metrology measurement is not required; dose is relatively independent of the focus changes; and focus and overlay data can be obtained from the same measurement.

Figure 2:
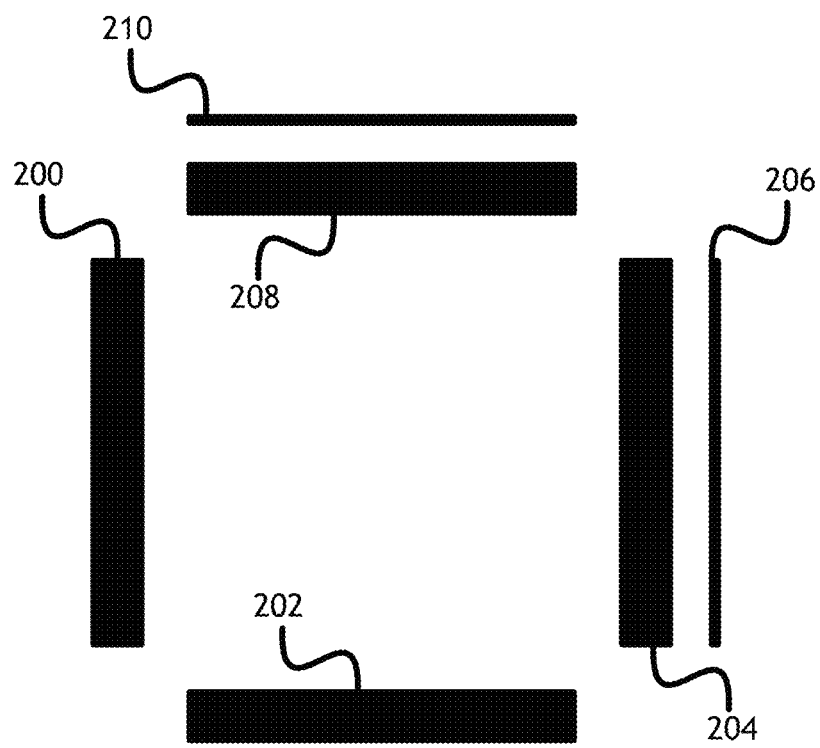
FIG. 2 shows a representation of mask elements including sub-resolution assist features for producing asymmetric profiles according to at least one embodiment of the present invention.

Referring to FIG. 2, a representation of mask elements including sub-resolution assist features for producing asymmetric profiles according to at least one embodiment of the present invention is shown. A mask may include main features 200, 202, 204, 208 that are intended to produce elements on a semiconductor wafer. The mask may also include one or more sub-resolution assist features 206, 210. Sub-resolution assist features 206, 210 produce or alter constructive or destructive interference to alter the shape or size of corresponding elements produced by main features 200, 202, 204, 208, and such alteration may be variable as a function of the focus of the mask. For example, a first Sub-resolution assist feature 206 associated with a third main feature 204 may alter the size of the area of a semiconductor illuminated during lithographic processing. Furthermore, such alteration may vary such that the size of the area increases as the focus of the mask varies.

Sub-resolution assist features 206, 210 may enhance or deteriorate image log slope and change profile asymmetry of the projected feature as compared to features without corresponding sub-resolution assist features 206, 210 by focus change to a scanner. Profile asymmetry may be used for focus monitoring and can be measured by means known in the art.

The resulting target may contain embedded asymmetries and focus sensitivity can be controlled by properties of the sub-resolution assist features 206, 210 such as the number or size of such sub-resolution assist features 206, 210. Also, the distance between the sub-resolution assist features 206, 210 and corresponding main features 204, 208 may be used to control the focus sensitivity.

The design of sub-resolution assist features 206, 210 is dependent on the lithography process. Metrology tools may measure sub-resolution assist features 206, 210 according to means known in the art.

Figure 3:
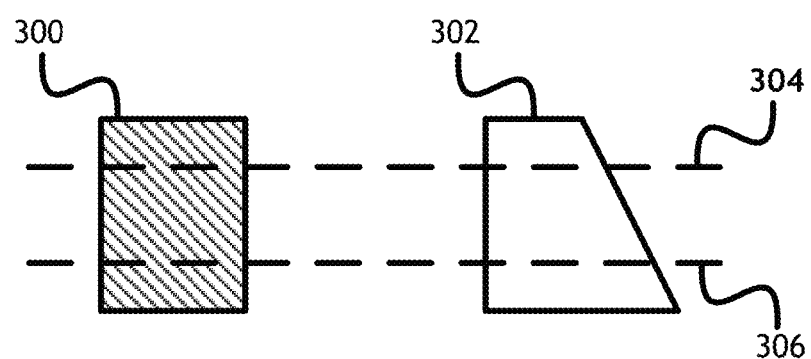
FIG. 3 shows a representation of asymmetric profiles produced by sub-resolution assist features in a lithographic mask.

Referring to FIG. 3, a representation of asymmetric profiles produced by sub-resolution assist features in a lithographic mask is shown. The profiles 300, 302 represent a cross-section of the projected images produced by a mask having main features and sub-resolution assist features. An unassisted profile 300 may be produced by a main feature. The unassisted profile 300 may be substantially the same at a first focal distance 304 and a second focal distance 306.

An assisted profile 302 may be produced by a main feature and a corresponding sub-resolution assist feature. The assisted profile 302 may vary as a function of distance from the projecting mask such that the size of the projected image of the assisted profile 302 at a first focal distance 304 is smaller than the size of the projected image at a second focal distance 306.

The unassisted profile 300 and assisted profile 302 are asymmetrical. During lithographic imaging, the focus of a scanner may be monitored by comparing an image corresponding to the unassisted profile 300 with an image corresponding to the assisted profile 302. Alternatively, profile asymmetry between the unassisted profile 300 and the assisted profile 302 may be measured by means known in the art. Furthermore, placement error of a sub-resolution assist feature may be measured using overlay techniques.

Figure 4:
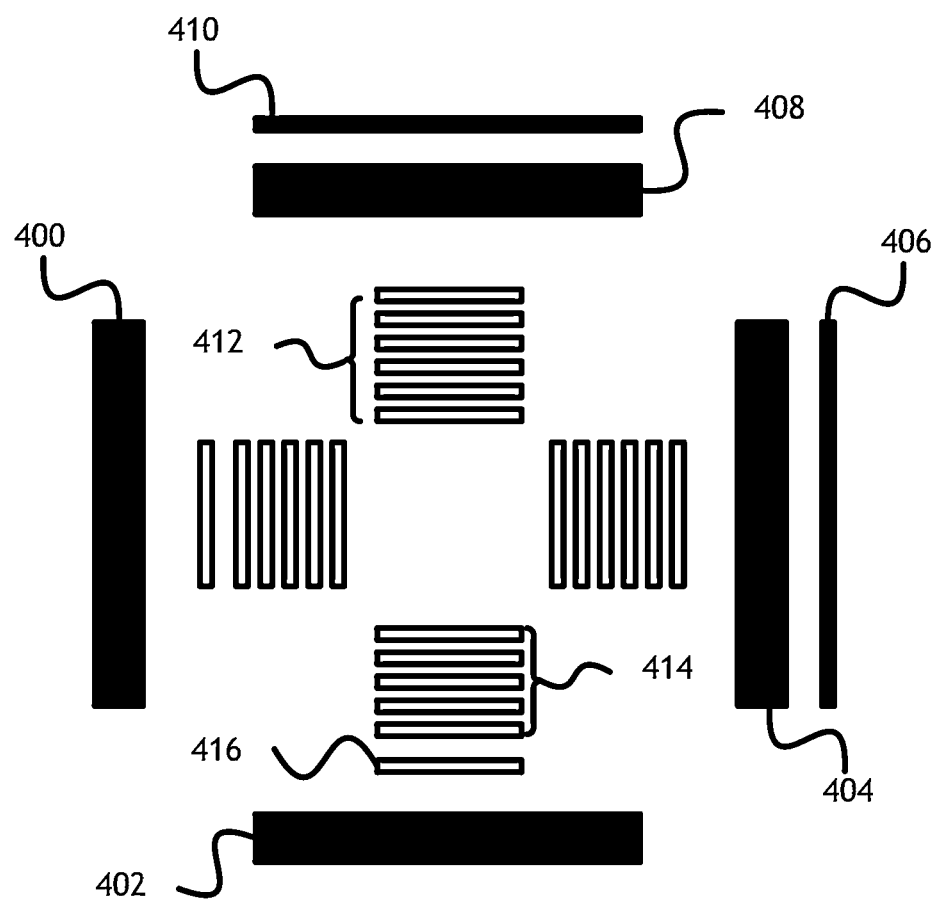
FIG. 4 shows a representation of mask elements including sub-resolution assist features for producing asymmetric profiles in dual corresponding designs according to another embodiment of the present invention.

Referring to FIG. 4, a representation of mask elements including sub-resolution assist features for producing asymmetric profiles in dual corresponding designs according to another embodiment of the present invention is shown. A mask may include a first design with first design main features 400, 402, 404, 408 that are intended to produce elements on a semiconductor wafer. The first design may also include one or more first design sub-resolution assist features 406, 410. First design sub-resolution assist features 406, 410 produce or alter constructive or destructive interference to alter the shape or size of corresponding elements produced by first design main features 400, 402, 404, 408, and such alteration may be variable as a function of the focus of the mask. For example, a first Sub-resolution assist feature 406 of the first design associated with a third main feature 404 of the first design may alter the size of the area of a semiconductor illuminated during lithographic processing. Furthermore, such alteration may vary such that the size of the area increases as the focus of the mask varies.

The mask may also include a second design with second design main features 412, 414 and one or more second design sub-resolution assist features 416. The second design main features 412, 414 may comprise a plurality of elements intended to constructively or destructively interference with each other to produce a projected image. A first sub-resolution assist feature 416 of the second design associated with a second main feature 414 of the second design may alter the size of the area of a semiconductor illuminated during lithographic processing.

Sub-resolution assist features 406, 410, 416 may enhance or deteriorate image log slope and change profile asymmetry of the projected feature as compared to features without corresponding sub-resolution assist features 406, 410, 412 by focus change to a scanner. Profile asymmetry may be used for focus monitoring and can be measured by means known in the art.

The resulting target may contain embedded asymmetries and focus sensitivity can be controlled by properties of the sub-resolution assist features 406, 410, 416 such as the number or size of such sub-resolution assist features 406, 410, 416. Also, the distance between the sub-resolution assist features 406, 410, 416 and corresponding main features 404, 408, 414 may be used to control the focus sensitivity.

The design of sub-resolution assist features 406, 410, 416 is dependent on the lithography process. Metrology tools may measure sub-resolution assist features 406, 410, 416 according to means known in the art.

In an embodiment including more than one corresponding design, focus can be measured by individual asymmetry results. For example, the second design may report one focus result and the first design can report another focus result. Differentiated results may also be used to measure focus.

Figure 5:
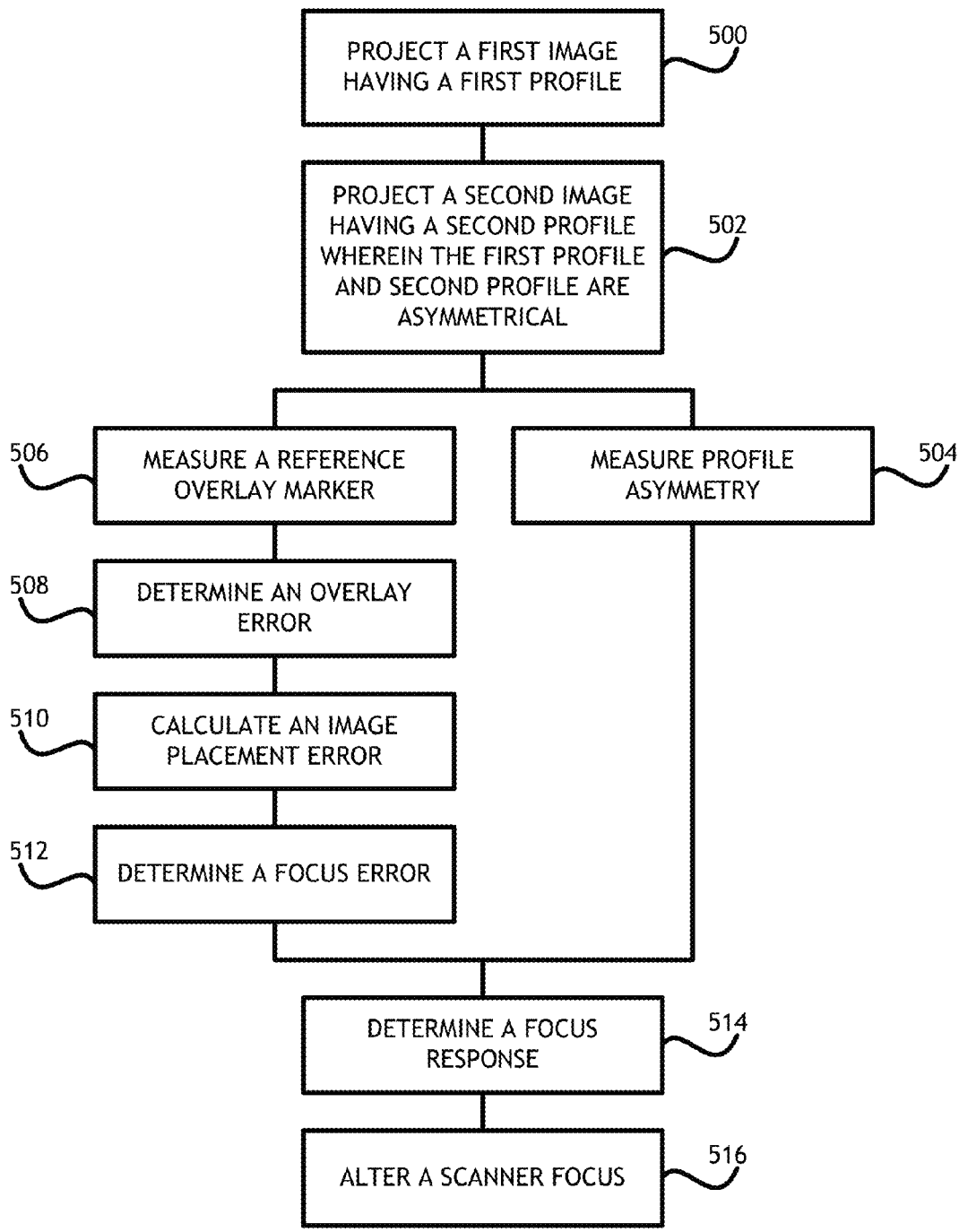
FIG. 5 shows a flowchart of a method for utilizing sub-resolution assist features for monitoring and maintaining focus during a lithographic process.

Referring to FIG. 5, a flowchart of a method for utilizing sub-resolution assist features for monitoring and maintaining focus during a lithographic process is shown. During a lithographic process, a first image having a first projection profile may be projected 500 on a semiconductor through a mask. A second image having a second projection profile may also be projected 502 on a semiconductor through a mask. The first projection profile and the second projection profile are asymmetrical such that profile asymmetries may be measured 504 to indicate a focus of a scanner used in the lithographic processes.

Additionally, measurement tools used in the lithographic process may measure 506 a reference overlay marker to determine 508 an overlay error. Based on the overlay error, an image placement error may be calculated 510. Unlike overlay error, image placement error is a function of focus. Once an image placement error is calculated, it may be used to determine 512 a focus error.

Profile Asymmetry and Image Placement Error are two separate focus responses on the same target. Both or either can be used but Profile Asymmetry is preferred because it is a singular solution. Both profile asymmetry and image placement error may be combined to determine 514 a focus response. Based on the focus response, a scanner focus may be altered 516 to produce a desired lithographic image. Embodiments of the present invention do not require deconvolution of dose or focus. Furthermore, using embodiments of the present invention, CD metrology measurement is not required; dose is relatively independent of the focus changes; and focus and overlay data can be obtained from the same measurement.

Utilizing embodiments of the present invention, detection of focus deviation or variation which is normally done on a tool basis, can be done on a wafer basis allowing for real time feedback and thereby improvement in process control and yield. Embodiments of the present invention may also utilize processes with reduced process windows in focus, thereby allowing production of chips with more aggressive lithography processes, possibly avoiding the high costs in other resolution enhancement techniques including advanced scanners, masks and resists.

It is believed that the present invention and many of its attendant advantages will be understood by the foregoing description of embodiments of the present invention, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An apparatus for monitoring focus during lithography comprising:
    a processor;
    memory connected to the processor; and
    computer executable program code configured to execute on the processor, wherein: the computer executable program code is configured to:
    receive a first image profile corresponding to a first mask element and a second image profile corresponding to a second mask element comprising a first sub-resolution assist feature, the first image profile and second image profile being asymmetrical;
    receive a third image profile corresponding to a third mask element and a fourth image profile corresponding to a fourth mask element comprising a second sub-resolution assist feature;
    measure a first profile asymmetry resulting from the first sub-resolution assist feature based on the first image profile and the second image profile; and
    measure a second profile asymmetry based on the third image profile and the fourth image profile; and
    determine a first focus response based on the first profile asymmetry and a second focus response based on the second profile asymmetry.

2. The apparatus of claim 1, wherein the computer executable program code is further configured to alter a scanner focus.

3. The apparatus of claim 1, wherein the computer executable program code is further configured to:
    measure a reference overlay marker;
    determine an overlay error;
    calculate an image placement error; and
    determine a focus error.

4. The apparatus of claim 2, wherein the computer executable program code is further configured to combine the first profile asymmetry and image placement error.

5. The apparatus of claim 4, wherein the computer executable program code is further configured to alter a scanner focus.

6. The apparatus of claim 1, wherein:
    the first mask element and the second mask element correspond to a first mask design; and
    the third mask element and the fourth mask element correspond to a second mask design.

7. The apparatus of claim 6, wherein the first focus response and second focus response correspond to different focus functions.

8. The apparatus of claim 6, wherein the computer executable program code is further configured to alter a scanner focus based on the second focus response.

9. A method for monitoring focus during lithography comprising:
    receiving a first image profile corresponding to a first mask element and a second image profile corresponding to a second mask element comprising a first sub-resolution assist feature, the first image profile and second image profile being asymmetrical;
    measuring a first profile asymmetry resulting from the first sub-resolution assist feature based on the first image profile and the second image profile;
    determining a first focus response based on the profile asymmetry;
    receiving a third image profile corresponding to a third mask element and a fourth image profile corresponding to a fourth mask element comprising a second sub-resolution assist feature;
    measuring a second profile asymmetry based on the third image profile and the fourth image profile; and
    determining a second focus response based on the second profile asymmetry.

10. The method of claim 9, further comprising altering a scanner focus.

11. The method of claim 9, further comprising:
    measuring a reference overlay marker;
    determining an overlay error;
    calculating an image placement error; and
    determining a focus error.

12. The method of claim 11, further comprising combining the profile asymmetry and image placement error.

13. The method of claim 12, further comprising altering a scanner focus.

14. The method of claim 9, wherein:
the first mask element and the second mask element correspond to a first mask design; and
the third mask element and the fourth mask element correspond to a second mask design.

15. The method of claim 14, wherein the focus response and second focus response correspond to different focus functions.

16. The method of claim 14, further comprising altering a scanner focus based on the second focus response.

17. The method of claim 14, further comprising determining a focus function based on at least one of the first focus response and the second focus response.

18. A lithographic mask comprising:
a first main feature configured to project an image having a first profile onto a semiconductor;
a second main feature configured to project an image having a second profile onto the semiconductor, the second profile comprising a first sub-resolution assist feature to make the first profile and second profile asymmetrical at a focus of a scanner in lithographic process;
a third main feature configured to project an image having a third profile onto a semiconductor; and
a fourth main feature configured to project an image having a fourth profile onto the semiconductor, the fourth profile comprising a second sub-resolution assist feature to make the third profile and fourth profile asymmetrical.

19. The lithographic mask of claim 18, wherein:
the first main feature and second main feature correspond to a first mask design;
the first profile and second profile asymmetry corresponds to a first focus response;
the third main feature and the fourth main feature correspond to a second mask design; and
the third profile and fourth profile asymmetry is a function of a focus of a scanner in a lithographic process.

20. The lithographic mask of claim 19, wherein the first profile and second profile asymmetry focus function and the third profile and fourth profile asymmetry focus function are different.

* * * * *